United States Patent
Takanashi et al.

(10) Patent No.: US 8,586,181 B2
(45) Date of Patent: Nov. 19, 2013

(54) PROTECTIVE SHEET FOR SOLAR CELL MODULE

(75) Inventors: Yasunari Takanashi, Itabashi (JP); Chiharu Okawara, Ushiku (JP); Shigenobu Yoshida, Ushiku (JP)

(73) Assignees: Lintec Corporation, Tokyo (JP); Mitsubishi Plastics, Inc., Tokyo (JP)

( * ) Notice: Subject to any disclaimer, the term of this patent is extended or adjusted under 35 U.S.C. 154(b) by 0 days.

(21) Appl. No.: 13/376,299

(22) PCT Filed: Jul. 8, 2010

(86) PCT No.: PCT/JP2010/061638
§ 371 (c)(1),
(2), (4) Date: Dec. 5, 2011

(87) PCT Pub. No.: WO2011/004872
PCT Pub. Date: Jan. 13, 2011

(65) Prior Publication Data
US 2012/0094131 A1  Apr. 19, 2012

(30) Foreign Application Priority Data
Jul. 9, 2009 (JP) ................... 2009-162580

(51) Int. Cl.
B32B 18/00 (2006.01)
B32B 27/08 (2006.01)
B32B 27/18 (2006.01)

(52) U.S. Cl.
USPC ............ 428/347; 428/421; 428/447; 428/702

(58) Field of Classification Search
None
See application file for complete search history.

(56) References Cited

U.S. PATENT DOCUMENTS

| | | | | |
|---|---|---|---|---|
| 5,532,304 A | * | 7/1996 | Miyazaki et al. | 524/261 |
| 2002/0050287 A1 | * | 5/2002 | Yamada et al. | 136/251 |

FOREIGN PATENT DOCUMENTS

| | | |
|---|---|---|
| JP | 2003-324211 A | 11/2003 |
| JP | 2006-257144 A | 9/2006 |
| JP | A-2007-035694 | 2/2007 |
| JP | A-2009-057391 | 3/2009 |
| WO | WO 2007010706 A1 | 1/2007 |

* cited by examiner

*Primary Examiner* — Ramsey Zacharia
(74) *Attorney, Agent, or Firm* — Christopher Casieri (57) ABSTRACT

Provided is a protective sheet for a solar cell module having a resin sheet, a vapor deposited layer containing an inorganic oxide provided on at least one side thereof, and a fluorine resin layer containing a silane coupling agent laminated on the vapor deposited layer.

6 Claims, 2 Drawing Sheets

PROTECTIVE SHEET FOR SOLAR CELL MODULE

This application is a 371 application of PCT/JP2010/061638, filed Jul. 8, 2010, which, in turn, claims priority of Japanese Patent Application No. 2009-162580, filed on Jul. 9, 2009.

TECHNICAL FIELD

The present invention relates to protective sheet for a solar cell module used as a front protective sheet or back protective sheet of a solar cell module.

BACKGROUND ART

Solar cell modules are devices that convert light energy from the sun into electrical energy, and are attracting attention as systems capable of generating electrical power without discharging carbon dioxide.

Figure 3:
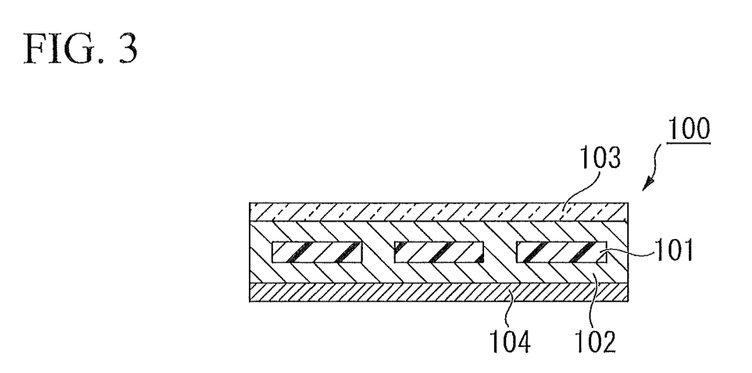
FIG. 3 is a schematic cross-sectional view showing an example of a solar cell module.

FIG. 3 is a schematic cross-sectional view of an example of a solar cell module.

This solar cell module 100 is roughly composed of solar cells 101 composed of crystalline silicon, a sealing material 102 that seals the solar cells 101, a front protective sheet (front sheet) 103 laminated onto the sealing material 102, and a back protective sheet (back sheet) 104 laminated into the sealing material 102.

In order to impart weather resistance and durability to the solar cell module 100 enabling it to withstand outdoor and indoor use over a long period of time, it is necessary to protect the solar cells 101 and the sealing material 102 from wind and rain, humidity, dust and mechanical impacts while also maintaining the inside of the solar cell module 100 in a sealed state that is isolated from the outside air. Consequently, the front protective sheet 103 and the back protective sheet 104 are required to have superior weather resistance, and are required to have a low level of water vapor permeability in particular.

A water impermeable sheet has been disclosed in which a vapor deposited layer that is substantially impermeable to water is provided on a base sheet composed of a resin such as polyethylene terephthalate for use as a protective sheet for a solar cell module having low water vapor permeability (see, for example, Patent Document 1).

PRIOR ART DOCUMENTS

Patent Documents

[Patent Document 1] International Publication No. WO 2007/010706

SUMMARY OF THE INVENTION

Problems to be Solved by the Invention

A technique has been considered for further improving the weather resistance of the aforementioned water impermeable sheet that makes it difficult for water to reach the vapor deposited layer. Therefore, one possible example of that technique consists of providing a water-repellent fluorine resin layer on the vapor deposited layer. However, in the case of attempting to provide a fluorine resin layer on a vapor deposited layer, it was difficult to adhere the fluorine resin layer to the water impermeable sheet due to low adhesion of the fluorine resin layer to the vapor deposited layer.

With the foregoing in view, an object of the present invention is to provide a protective sheet for a solar cell module that improves adhesion of a fluorine resin layer to an inorganic oxide deposited layer, increases moisture resistance and enables solar cells to be used stably over a long period of time in the case of using as a front sheet or back sheet of a solar cell module.

The protective sheet for a solar cell module of the present invention has a resin sheet, a vapor deposited layer composed of an inorganic oxide provided on at least one side thereof, and a fluorine resin layer containing a silane coupling agent laminated onto the vapor deposited layer.

The silane coupling agent in the protective sheet for a solar cell module of the present invention is preferably an alkoxysilane.

Effects of the Invention

According to the protective sheet for a solar cell module of the present invention, since the protective sheet has a resin sheet, a vapor deposited layer composed of an inorganic oxide provided on at least one side thereof, and a fluorine resin layer containing a silane coupling agent laminated onto the vapor deposited layer, it is able to improve adhesion of the fluorine resin layer to the vapor deposited layer and inhibit the fluorine resin layer from separating from the vapor deposited layer. For this reason, the laminated state of the fluorine resin layer on the resin sheet can be maintained, thereby enhancing moist heat resistance. Consequently, this enables solar cells to be used stably for a long period of time.

EMBODIMENTS OF THE INVENTION

The following provides an explanation of embodiments of the protective sheet for a solar cell module of the present invention.

Furthermore, these embodiments are intended to provide specific explanations to make the purport of the invention more readily understandable, and are not intended to limit the present invention unless specifically indicated otherwise.

(1) First Embodiment

Aspect

Figure 1:
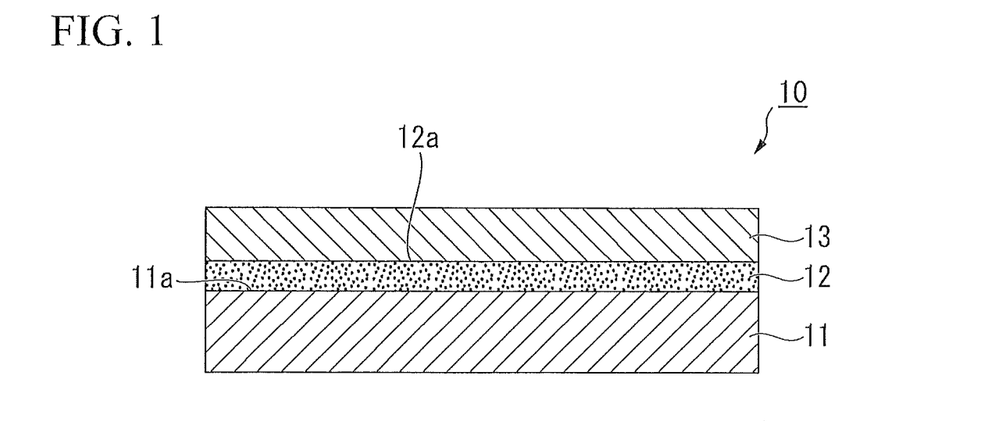
FIG. 1 is a schematic cross-sectional view showing a first embodiment of a protective sheet for a solar cell module of the present invention.

FIG. 1 is a schematic cross-sectional view of a first embodiment of the protective sheet for a solar cell module of the present invention.

A protective sheet 10 for a solar cell module of this embodiment has a vapor deposited layer 12 composed of an inorganic oxide provided on one side 11a of a resin sheet 11, and a fluorine resin layer 13 containing a silane coupling agent laminated onto an opposite side 12a (also referred to as the "other side") from the side contacted by the resin sheet 11 of the vapor deposited layer 12.

In the protective sheet 10 for a solar cell module, the silane coupling agent contained in the fluorine resin layer 13 has affinity for the vapor deposited layer 12. Consequently, it is difficult for the fluorine resin layer 13 to separate from the resin sheet 11.

A resin sheet commonly used as a resin sheet in a protective sheet for a solar cell module is selected for use as the resin sheet 11. Examples of the resin sheet 11 include sheets composed of polymers such as polyethylene, polypropylene, polystyrene, poly(methyl methacrylate), polytetrafluoroethylene, polyamide (Nylon 6, Nylon 66), polyacrylonitrile, polyvinyl chloride, polyethylene terephthalate (PET), polybutylene terephthalate (PBT), polyethylene naphthalate (PEN), polyoxymethylene, polycarbonate, polyphenylene oxide, polyester urethane, poly-m-phenylene isophthalamide or poly-p-phenylene terephthalamide. Among these, sheets composed of polyesters such as PET, PBT or PEN are preferable due to their favorable electrical insulating properties, heat resistance, chemical resistance, dimensional stability and moldability, while PET sheets or PEN sheets are particularly preferable.

In addition, the aforementioned resin sheet can contain known additives such as antistatic agents, light blocking agents, ultraviolet absorbers, plasticizers, slipping agents, fillers, colorants, photostabilizers, heat stabilizers, lubricants, crosslinking agents, anti-blocking agents or antioxidants.

The thickness of the resin sheet 11 is suitably set based on the electrical insulating properties required by the solar cell module, and normally is preferably within the range of 10 μm to 300 μm. More specifically, in the case the resin sheet 11 is a polyester-based sheet, the thickness thereof is preferably within the range of 20 μm to 300 μm, more preferably within the range of 30 μm to 200 μm, and most preferably within the range of 50 μM to 150 μm from the viewpoints of light weight and electrical insulating properties.

Furthermore, in order to improve adhesion to the vapor deposited layer, surface treatment such as flame treatment, corona discharge treatment, plasma discharge treatment or anchor coating treatment is preferably carried out on the aforementioned resin sheet.

Examples of anchor coating agents include solvent-based or aqueous polyester-based resin, urethane-based resin, acrylic resin, vinyl alcohol-based resin, ethylene vinyl alcohol-based resin, vinyl-modified resin, modified styrene resin, modified silicone resin, isocyanate resin, epoxy resin, melamine resin, oxazoline group-containing resins, carbodiimide group-containing resins, aziridine-based resin and alkyl titanates, and these can be used alone or two or more types can be used in combination. In particular, combinations of resins having a reactive functional group and resins having a crosslinking group are preferable in terms of durability and adhesion.

In addition, the aforementioned anchor coating agent can contain a known additive such as an antistatic agent, light blocking agent, ultraviolet absorber, photostabilizer, heat stabilizer, lubricant, anti-blocking agent or antioxidant.

The thickness of the anchor coating layer is preferably 0.005 μm to 5 μm and more preferably 0.01 μm to 1 μm. If the thickness is 5 μm or less, slipping is favorable and there is hardly any separation from the base film caused by internal stress of the anchor coating layer per se, while if the thickness is 0.005 μm or more, a uniform thickness can be maintained, thereby making this preferable.

In addition, ordinary surface treatment such as chemical treatment or discharge treatment may be carried out on the base film prior to coating with the anchor coating agent to improve coatability and adhesion of the anchor coating agent to the base film.

There are no particular limitations on the vapor deposited layer 12 provided it is formed by vapor deposition of an inorganic oxide onto one side 11a of the resin sheet 11.

Examples of vapor deposition methods used to form the vapor deposited layer 12 include chemical vapor phase methods such as plasma chemical vapor phase growth, thermochemical vapor phase growth or photochemical vapor phase growth, or physical vapor phase methods such as vacuum deposition, sputtering or ion plating. Among these methods, vacuum deposition is preferable in the case of considering ease of operation and controllability of layer thickness.

The vapor deposited layer 12 functions as a moisture-resistant layer having water vapor impermeability. In addition, the vapor deposited layer 12 is able to enhance weather resistance of a solar cell module by being applied to a solar cell module.

Examples of the inorganic oxide that composes the vapor deposited layer 12 include at least one type of an oxide of silicon (Si), aluminum (Al), magnesium (Mg), calcium (Ca), potassium (K), tin (Sn), sodium (Na), boron (B), titanium (Ti), lead (Pb), zirconium (Zr) or yttrium (Y). In particular, at least one type of silicon oxide, aluminum oxide, titanium oxide and mixtures thereof are preferable, and silicon oxide and/or aluminum oxide are more preferable. In particular, silicon oxide is preferable from the viewpoint of being able to stably maintain a high degree of gas impermeability. In addition, oxides other than the inorganic oxides listed above may also be further contained in the vapor deposited layer 12.

In addition, in order to improve adhesion between the vapor deposited layer and the fluorine resin layer that is an object of the present invention, the value of x of the elemental composition $SiO_x$ of a silicon oxide vapor deposited layer is preferably 1.2 to 1.9 ($1.2 \leq x \leq 1.9$) and more preferably 1.3 to 1.8. Although adhesion of the fluorine resin layer improves as the degree of oxidation x becomes smaller, coloring of the vapor deposited layer becomes more intense. If the degree of oxidation is $1.2 \leq x \leq 1.9$ and more preferably $1.3 \leq x \leq 1.8$, the surface of the vapor deposited layer is easily wetted from the viewpoint of surface tension, affinity between the vapor deposited layer surface and the silane coupling agent improves, and adhesion with the fluorine resin layer is further improved, thereby making this preferable.

The elemental composition can be measured using X-ray photoelectron spectroscopy (ESCA)(XPS).

The vapor deposited layer 12 may be composed of one type of inorganic oxide or by a plurality of types of inorganic oxides.

In the case the vapor deposited layer 12 is composed of a plurality of inorganic oxides, the vapor deposited layer may have a laminated structure in which layers composed of each of the inorganic oxides are deposited in order, or the plurality of inorganic oxides may be deposited simultaneously.

The thickness of vapor deposited layer 12 is suitably set in consideration of water vapor impermeability, and is changed according to the type of inorganic oxide used, deposition density and the like. The thickness of the vapor deposited layer 12 is preferably 5 nm to 200 nm and more preferably 10 nm to 100 nm.

The fluorine resin layer 13 is formed by coating a coating material containing a fluorine-containing resin directly onto other side 12a of the vapor deposited layer 12. The fluorine resin layer 13 can be formed by coating the coating material which becomes a coated film having a desired thickness.

The fluorine resin layer 13 serves as a protective layer having water impermeability as a result of curing the coating material containing the fluorine-containing resin and the silane coupling agent. In addition, the fluorine resin layer 13 is able to improve weather resistance and chemical resistance of a solar cell module by being applied to a solar cell module.

There are no particular limitations on the coating material containing the fluorine-containing resin and the silane coupling agent provided it forms the fluorine resin layer 13 after drying and curing without impairing the effects of the present invention, and there are no particular limitations thereon provided it is dissolved or dispersed in a solvent and can be coated on the other side 12a of the vapor deposited layer 12.

There are no particular limitations on the fluorine-containing resin contained in the coating material provided it is a resin that contains fluorine without impairing the effects of the present invention, and a coating material is used that can be dissolved or dispersed in a coating material solvent (organic solvent or water) and crosslinked.

A fluoroolefin having a curable functional group is preferably used for the fluorine-containing resin contained in the coating material.

Examples of curable functional groups include a hydroxyl group, carboxyl group, amino group and glycidyl group, and a hydroxyl group is preferable from the viewpoint of having favorable curability.

Fluoroolefins containing a hydroxyl group can be obtained by copolymerizing monomers containing a hydroxyl group.

Examples of monomers containing a hydroxyl group include hydroxyalkyl vinyl ethers such as 4-hydroxybutyl vinyl ether or 2-hydroxyethyl vinyl ether.

Examples of copolymerizable monomers that form fluoroolefin resins include vinyl esters of carboxylic acids such as vinyl acetate, vinyl propionate, butyl butyrate, vinyl isobutyrate, vinyl pivalate, vinyl caproate, vinyl versatate, vinyl laurate, vinyl stearate or vinyl cyclohexylcarbonate, and alkylvinyl ethers such as methyl vinyl ether, ethyl vinyl ether, butyl vinyl ether, or cyclohexyl vinyl ether.

More specifically, examples of fluororesins include polymers composed mainly of chlorotrifluoroethylene (CTFE), such as Lumiflon (trade name) manufactured by Asahi Glass Co., Ltd., Cefral Coat (trade name) manufactured by Central Glass Co., Ltd. or Fluonate (trade name) manufactured by DIC Corp., and polymers composed mainly of tetrafluoroethylene (TFE) such as Zeffle (trade name) manufactured by Daikin Industries, Ltd.

Lumiflon is an amorphous resin containing as main constituent units thereof CTFE and several types of specific alkyl vinyl ethers and hydroxyalkyl vinyl ethers. Resins having monomer units of hydroxyalkyl vinyl ethers in the manner of Lumiflon (trade name) are preferable since they demonstrate superior solvent solubility, crosslinking reactivity, base adhesion, pigment dispersibility, hardness and flexibility.

Zeffle is a copolymer of TFE and an organic solvent-soluble hydrocarbon olefin, and that containing a hydrocarbon olefin provided with a highly reactive hydroxyl group is particularly preferable since it demonstrates superior solvent solubility, crosslinking reactivity, base adhesion and pigment dispersibility.

The coating material may contain a crosslinking agent, catalyst and solvent in addition to the aforementioned fluorine-containing resin, and may further contain inorganic compounds such as a pigment or filler as necessary.

There are no particular limitations on the solvent contained in the coating material provides it does not impair the effects of the present invention, and a solvent is preferably used that contains one type or two or more types of organic solvents selected from the group consisting of methyl ethyl ketone (MEK), cyclohexanone, acetone, methyl isobutyl ketone (MIBK), toluene, xylene, methanol, isopropanol, ethanol, heptane, ethyl acetate, isopropyl acetate, n-butyl acetate and n-butyl alcohol.

Among such solvents, the solvent preferably contains one type or two or more types of organic solvents selected from the group consisting of xylene, cyclohexanone and MEK from the viewpoints of solubility of components contained in the coating material and the low rate of remaining in the coated film (low boiling point temperature).

There are no particular limitations on the pigment and filler contained in the coating material provided they do not impair the effects of the present invention, and examples thereof that are used include titanium dioxide, carbon black, perylene pigment, mica, polyamide powder, boron nitride, zinc oxide, aluminum oxide and silica. More specifically, rutile titanium dioxide (Ti-Pure R105, trade name, E.I. du Pont de Nemours and Company), which is a rutile titanium dioxide coated with silicon dioxide, and hydrophobic silica, in which hydroxyl groups on the surface of silica have been modified by surface treatment with dimethyl silicone (Cab-O-Sil TS-720, trade name, Cabot Corp.), are used preferably for the pigment and filler since they impart durability.

Furthermore, in the case of being a front sheet, the protective sheet for a solar cell module of the present invention is required to be transparent and enable superior transmission of light in the visible light range in particular, and it is preferable that the amount of pigment and filler be small. In the case of being a back sheet, it is preferably colored white using a white pigment such as titanium oxide in order to impart reflectivity and improve photoelectric efficiency while conversely not being required to be transparent.

The coated film serving as the fluorine resin layer 13 is preferably cured with a crosslinking agent to improve durability and scratch resistance.

There are no particular limitations on the crosslinking agent provided it does not impair the effects of the present invention, and examples of crosslinking agents that are used preferably include metal chelates, isocyanates and melamines. In the case of assuming that the protective sheet 10 for a solar cell module is to be used outdoors for a long period of time, an aliphatic isocyanate is preferable for the crosslinking agent from the viewpoint of weather resistance.

There are no particular limitations on the composition of the coating material provided it does not impair the effects of the present invention, and is prepared by mixing a fluoroolefin resin, pigment, crosslinking agent, catalyst, silane coupling agent and solvent.

The composite ratio of this composition is preferably such that the content of solid components such as the fluoroolefin resin, pigment, crosslinking agent, catalyst and silane coupling agent is 80% by weight to 20% by weight, and more preferably 70% by weight to 30% by weight.

In addition, the composite ratio of each component of the aforementioned solid components is such that the content of the fluoroolefin resin is preferably 40% by weight to 95% by weight and more preferably 45% by weight to 90% by weight, and the content of the silane coupling agent is preferably 0.1% by weight to 10% by weight and more preferably 0.2% by weight to 5% by weight, based on a value of 100% by weight for the total amount of solid components. In addition, in the case the composition contains pigment, the content of the pigment is preferably 20% by weight to 50% by weight and more preferably 30% by weight to 40% by weight based on a value of 100% by weight for the total amount of solid components.

In addition, examples of catalysts used include dibutyltin dilaurate and dioctyltin dilaurate, and these catalysts are used to promote crosslinking between the Lumiflon and isocyanate in the solvent.

A known method is used to coat the coating material onto the other side 12a of the vapor deposited layer 12, and for example, may be coated to a desired thickness with a bar coater (rod coater).

The drying temperature of the coating material that has been coated onto the other side 12a of the vapor deposited layer 12 is a temperature that does impair the effects of the present invention, and is preferably within the range of 50° C. to 130° C. from the viewpoints of reducing thermal deformation of the resin sheet 11.

Although there are no particular limitations on the thickness of the fluorine resin layer 13 formed by curing the coating material provided it does not impair the effects of the present invention, it is preferably 5 μm to 50 more preferably 8 μm to 40 μm, and most preferably 10 μm to 30 μm from the viewpoints of weather resistance and light weight.

An alkoxysilane can be selected for use as the silane coupling agent. An alkoxysilane is a silane compound in which a compound in which oxygen is bonded with an alkyl group ($-OC_nH_{2n+1}$) constitutes the silicon side chain. The alkoxysilane may be a compound in which all of the side chains are the aforementioned compound, or a compound in which a portion of the side chains are the aforementioned compound while the other side chains are other compounds.

A silane coupling agent is a compound in which a hydrogen atom bonded to a silane is substituted for another atom or atom group, and has silicon at the core thereof. The fluorine resin layer 13 contains silicon, has affinity for the inorganic compound of the vapor deposited layer 12, and particularly in the case the vapor deposited layer 12 contains silicon oxide, the fluorine resin layer 13 demonstrates favorable affinity for the vapor deposited layer 12.

Preferable examples of alkoxysilanes include 3-glycidyloxypropyltrimethoxysilane represented by the following chemical formula (1), 3-acetoxypropyltrimethoxy-silane represented by the following chemical formula (2), phenyltrimethoxysilane represented by the following chemical formula (3), and tetraethoxysilane represented by the following chemical formula (4), and among these, 3-glycidyloxypropyl-trimethoxysilane is particularly preferable. In addition to 3-glycidyloxypropyltrimethoxysilane, alkoxysilanes having an epoxy group such as 3-glycidylpropylmethyldiethoxysilane, 3-glycidylpropyltriethoxysilane or 2-(3,4-epoxycyclohexyl)ethyltrimethoxysilane are particularly preferable. One type of these alkoxysilanes may be used alone or two or more types may be used in combination.

[Chemical Formula 1]

(1)

[Chemical Formula 2]

(2)

[Chemical Formula 3]

(3)

[Chemical Formula 4]

(4)

According to the protective sheet 10 for a solar cell module, since the fluorine resin layer 13 contains a silane coupling agent, separation of the fluorine resin layer 13 from the vapor deposited layer 12 can be inhibited. For this reason, the fluorine resin 13 can be maintained in a laminated state on the resin sheet 11, favorable water repellency is effectively demonstrated by the fluorine resin layer 13, and moist heat resistance is increased. Consequently, the solar cell module can be stably used for a long period of time.

Furthermore, although this embodiment has indicated the example of the protective sheet 10 for a solar cell module in which the vapor deposited layer 12 is provided on the one side 11a of the resin sheet 11, the protective sheet for a solar cell module of the present invention is not limited thereto. A vapor deposited layer may also be provided on both sides of a resin sheet (one side and the other side) in the protective sheet for a solar cell module of the present invention. In the case of providing a vapor deposited layer on one side of the resin sheet, a fluorine resin layer containing a silane coupling agent is laminated on the other side of the vapor deposited layer (side on the opposite side from the side in contact with the resin sheet). In the case the vapor deposited layer is provided on both sides of the resin sheet, the fluorine resin layer containing the silane coupling agent is laminated on other side of the either of vapor deposited layer (opposite side from the side in contact with the resin sheet).

(2) Second Embodiment

Figure 2:
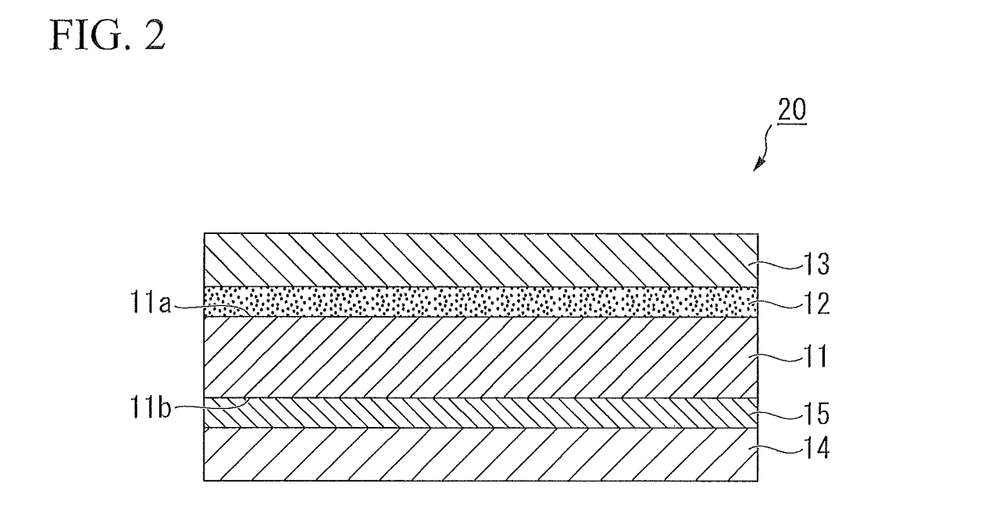
FIG. 2 is a schematic cross-sectional view showing a second embodiment of a protective sheet for a solar cell module of the present invention.

FIG. 2 is a schematic cross-sectional view showing a second embodiment of the protective sheet for a solar cell module of the present invention.

In FIG. 2, the same reference symbols are used to indicate those constituents that are the same as those of the protective sheet 10 for a solar cell module shown in FIG. 1, and an explanation thereof is omitted.

A protective sheet 20 for a solar cell module of this embodiment is applied to a front sheet and back sheet of a solar cell module in the same manner as the first embodiment.

A thermal adhesive layer 14 is provided in the protective sheet 20 for a solar cell module in addition to the structure of the protective sheet 10 for a solar cell module of the first embodiment.

The thermal adhesive layer 14 is laminated to a side 11b (to be referred to as the other side) on the opposite side of the resin sheet 11 from the side on which the fluorine resin layer 13 is laminated, with an adhesive layer 15 interposed there between.

Thermal adhesion of the thermal adhesive layer 14 refers to a property enabling the demonstration of adhesion as a result of heating treatment. In the present invention, there are no particular limitations on the resin that composes the thermal adhesive layer 14 provided it has thermal adhesion. The temperature of the heating treatment is normally within the range of 50° C. to 200° C.

Preferable examples of resins that compose the thermal adhesive layer 14 include resins composed of polymers consisting mainly of ethyl vinyl acetate (EVA) or polyolefin, and resins composed of a polymer consisting mainly of EVA are more preferable.

Although a sealing resin composed of EVA is frequently used for the sealing material that composes the solar cell module, the use of a resin composed of a polymer mainly consisting of EVA for the thermal adhesive layer 14 makes it possible to improve compatibility and adhesion between the sealing material and the thermal adhesive layer 14.

There are no particular limitations on the thickness of the thermal adhesive layer 14 provided it does not impair the effects of the present invention, and is suitably adjusted corresponding to the type of the thermal adhesive layer 14. For example, the thickness of the thermal adhesive layer 14 is preferably within the range of 1 μm to 200 μm. More specifically, in the case the thermal adhesive layer 14 is composed of EVA, the thickness is preferably within the range of 10 μm to 200 μm, more preferably within the range of 50 μm to 150 μm, and most preferably within the range of 80 μm to 120 μm, from the viewpoints of light weight, electrical insulating properties and the like.

The adhesive layer 15 is composed of an adhesive that demonstrates adhesion to the resin sheet 11 and the thermal adhesive layer 14.

There are no particular limitations on the adhesive that composes the adhesive layer 15 provided it does not impair the effects of the present invention, and examples of adhesives used include acrylic-based adhesives, urethane-based adhesives, epoxy-based adhesives and ester-based adhesives. One type of these adhesives may be used alone or two or more types may be used in combination.

According to the protective sheet 20 for a solar cell module, since the thermal adhesive layer 14 is provided in addition to the protective sheet 10 for a solar cell module of the first embodiment, the protective sheet 20 for a solar cell module can be easily thermally adhered to the sealing material of the solar cell module.

Furthermore, although the protective sheet 20 for a solar cell module provided with the thermal adhesive layer 14 on the other side 11b of the resin sheet 11 with the adhesive layer 15 interposed there between was illustrated as an example in this embodiment, the protective sheet for a solar cell module of the present invention is not limited thereto. The thermal adhesive layer may also be directly laminated onto the other side 11b of the resin sheet 11 in the protective sheet for a solar cell module of the present invention.

EXAMPLES

Although the following provides a more detailed explanation of the present invention through examples thereof, the present invention is not limited to the following examples.

Example 1

Formation of Vapor Deposited Layer

A vapor deposited layer composed of a metal oxide in the form of silicon dioxide ($SiO_2$) was formed by using a PET film having a thickness of 12 μm as a resin sheet and depositing the silicon dioxide to a thickness of 50 nm on one side of this PET film by vapor deposition.

Vapor deposition of the silicon dioxide was carried out under the conditions indicated below.
Plasma generation source: Argon
Target material: Silicon dioxide
Gas flow rate: Argon at 100 scm
Power value: RF 2000 W
Chamber internal pressure: 0.2 Pa
[Formation of Fluorine Resin Layer]

Coating materials were fabricated in accordance with the formulation ratios shown in Tables 1 and 2, and the coating materials containing fluorine-containing resin were coated onto other side of the vapor deposited layer to a thickness after drying of 13 μm using a bar coater, followed by drying for 1 minute at 130° C. to form a fluorine resin layer and fabricate the protective layer 10 for a solar cell module (Examples 1 to 25).

The upper portions of the Tables 1 and 2 indicate the compositions of the coating materials containing fluorine-containing resin and all values are represented in percent by weight (wt %).

The Lumiflon LF200 (trade name, Asahi Glass Co., Ltd.) used to form the fluorine resin layer is a CTFE-based copolymer, the Sumidur N3300 (Sumika Bayer Urethane Co., Ltd.) is an isocyanate-based crosslinking agent, the Ti-Pure R105 (trade name, E.I. du Pont de Nemours and Company) is titanium dioxide, and the Cab-O-Sil TS-720 (trade name, Cabot Corp.) is hydrophobic silica.

[Measurement of Adhesion of Fluorine Resin Layer]

Adhesion of the fluorine resin layer was evaluated for the protective sheets for a solar cell module fabricated in Examples 1 to 25 in compliance with Japanese Industrial Standard JIS K5600-5-6, "Testing Methods for Paints, Part 5 Mechanical Property of Film, Section 6 Adhesion Test (Cross-Cut Test)".

Cuts were made in the surface (outer surface) of the fluorine resin layer at 1 mm intervals to form a crosscut pattern consisting of 100 squares (10 squares high×10 squares across), and after adhering cellophane tape (trade name: CT-24, Nichiban Co., Ltd.) to the crosscut pattern, the number of squares of the fluorine resin layer that remained on the crosscut pattern without being separated therefrom was investigated when the cellophane tape was peeled off.

In addition, the same adhesion test was carried out after carrying out an environmental test on the protective sheets for a solar cell module fabricated in Test Examples 1 to 25 by allowing to stand for 24 hours under conditions consisting of a temperature of 121° C., relative humidity of 100% and pressure of 2 atm.

The results are shown in Tables 1 and 2.

TABLE 1

| Materials | \multicolumn{13}{c}{Test Examples} |
|---|---|---|---|---|---|---|---|---|---|---|---|---|---|
| | 1 | 2 | 3 | 4 | 5 | 6 | 7 | 8 | 9 | 10 | 11 | 12 | 13 |
| Lumiflon LF200 | 84.47 | 84.06 | 84.47 | 84.06 | 84.47 | 84.06 | 84.47 | 84.06 | 84.47 | 84.06 | 52.37 | 52.11 | 51.58 |
| Sumidur N3300 | 15.02 | 14.95 | 15.02 | 14.95 | 15.02 | 14.95 | 15.02 | 14.95 | 15.02 | 14.95 | 9.31 | 9.27 | 9.17 |
| Ti-Pure R105 | — | — | — | — | — | — | — | — | — | — | 32.01 | 31.85 | 31.52 |
| Cab-O-Sil TS-720 | — | — | — | — | — | — | — | — | — | — | 5.82 | 5.79 | 5.73 |
| Dioctyltin dilaurate | 0.0001 | 0.0001 | 0.0001 | 0.0001 | 0.0001 | 0.0001 | 0.0001 | 0.0001 | 0.0001 | 0.0001 | 0.0001 | 0.0001 | 0.0001 |
| Tetraethoxy-silane | 0.50 | 1.00 | — | — | — | — | — | — | — | — | 0.50 | 1.00 | 2.00 |
| 3-aminopropyl-triethoxy-silane | — | — | 0.50 | 1.00 | — | — | — | — | — | — | — | — | — |
| 3-acetoxypropyl-trimethoxy-silane | — | — | — | — | 0.50 | 1.00 | — | — | — | — | — | — | — |
| Phenyltri-methoxysilane | — | — | — | — | — | — | 0.50 | 1.00 | — | — | — | — | — |
| 3-glycidyloxy-propyltri-methoxysilane | — | — | — | — | — | — | — | — | 0.50 | 1.00 | — | — | — |
| Crosscut adhesion test (after environmental test/before environmental test) | 0/100 | 26/100 | Sedimentation, not evaluated | Sedimentation, not evaluated | 0/100 | 0/100 | 0/100 | 75/100 | 99/100 | 99/100 | 9/100 | 9/100 | 7/100 |

TABLE 2

| Materials | \multicolumn{12}{c}{Examples} |
|---|---|---|---|---|---|---|---|---|---|---|---|---|
| | 14 | 15 | 16 | 17 | 18 | 19 | 20 | 21 | 22 | 23 | 24 | 25 |
| Lumiflon LF200 | 52.37 | 52.11 | 51.58 | 52.37 | 52.11 | 51.58 | 52.37 | 52.11 | 51.58 | 52.37 | 52.11 | 51.58 |
| Sumidur N3300 | 9.31 | 9.27 | 9.17 | 9.31 | 9.27 | 9.17 | 9.31 | 9.27 | 9.17 | 9.31 | 9.27 | 9.17 |
| Ti-Pure R105 | 32.01 | 31.85 | 31.52 | 32.01 | 31.85 | 31.52 | 32.01 | 31.85 | 31.52 | 32.01 | 31.85 | 31.52 |
| Cab-O-Sil TS-720 | 5.82 | 5.79 | 5.73 | 5.82 | 5.79 | 5.73 | 5.82 | 5.79 | 5.73 | 5.82 | 5.79 | 5.73 |
| Dioctyltin dilaurate | 0.0001 | 0.0001 | 0.0001 | 0.0001 | 0.0001 | 0.0001 | 0.0001 | 0.0001 | 0.0001 | 0.0001 | 0.0001 | 0.0001 |
| Tetraethoxy-silane | — | — | — | — | — | — | — | — | — | — | — | — |
| 3-aminopropyl-triethoxy-silane | 0.50 | 1.00 | 2.00 | — | — | — | — | — | — | — | — | — |
| 3-acetoxypropyl-trimethoxy-silane | — | — | — | 0.50 | 1.00 | 2.00 | — | — | — | — | — | — |
| Phenyltri-methoxysilane | — | — | — | — | — | — | 0.50 | 1.00 | 2.00 | — | — | — |
| 3-glycidyloxy-propyltri-methoxysilane | — | — | — | — | — | — | — | — | — | 0.50 | 1.00 | 2.00 |
| Crosscut adhesion test (after environmental test/before environmental test) | Sedimentation, not evaluated | Sedimentation, not evaluated | Sedimentation, not evaluated | 2/100 | 11/100 | 10/100 | 9/100 | 33/100 | 88/100 | 99/100 | 99/100 | 97/100 |

Based on the results of Tables 1 and 2, when phenyltrimethoxysilane or 3-glycidyloxypropyl-trimethoxysilane is used for the silane coupling agent in Test Examples 1 to 25, the separation rate of the fluorine resin layer 14 was determined to decrease and adhesion of the fluorine resin layer 14 to the vapor deposited layer 12 was determined to be favorable.

Example 2

Silicon oxide having a purity of 99.9% was thermally deposited at the rate of 100 nm/s to obtain a silicon oxide vapor deposited layer by using a PEN film having a thickness of 12 μm for the resin sheet, supplying this film to a vacuum deposition device, and heating with a 10 kW electron beam in a vacuum at $1\times10^{-4}$ Torr.

The elemental composition of the vapor deposited layer was analyzed using the K-Alpha XPS Analyzer manufactured by Thermo Fisher Scientific K.K. and found to be SiOx (x=1.7).

The water vapor permeation rate was $3\times10^{-2}$ g/m$^2$/24 hr.

ited layer in the manner of Example 2 and forming the fluorine resin in accordance with the components and formulation ratios of the coating materials shown in Table 3, followed by measurement of adhesion of the fluorine resin layer.

The results are shown in Table 3.

TABLE 3

| Materials | Test Examples | | | | | | | | | |
|---|---|---|---|---|---|---|---|---|---|---|
| | 26 | 27 | 28 | 29 | 30 | 31 | 32 | 33 | 34 | 35 |
| Lumiflon LF200 | 84.47 | 84.06 | 84.47 | 84.06 | 52.37 | 52.11 | 51.58 | 52.37 | 52.11 | 51.58 |
| Sumidur N3300 | 15.02 | 14.95 | 15.02 | 14.95 | 9.31 | 9.27 | 9.17 | 9.31 | 9.27 | 9.17 |
| Ti-Pure R105 | — | — | — | — | 32.01 | 31.85 | 31.52 | 32.01 | 31.85 | 31.52 |
| Cab-O-Sil TS-720 | — | — | — | — | 5.82 | 5.79 | 5.73 | 5.82 | 5.79 | 5.73 |
| Dioctyltin dilaurate | 0.0001 | 0.0001 | 0.0001 | 0.0001 | 0.0001 | 0.0001 | 0.0001 | 0.0001 | 0.0001 | 0.0001 |
| Tetraethoxysilane | — | — | — | — | — | — | — | — | — | — |
| 3-aminopropyltriethoxysilane | — | — | — | — | — | — | — | — | — | — |
| 3-acetoxypropyltrimethoxysilane | — | — | — | — | — | — | — | — | — | — |
| Phenyltrimethoxysilane | 0.50 | 1.00 | — | — | 0.50 | 1.00 | 2.00 | — | — | — |
| 3-glycidyloxypropyltrimethoxysilane | — | — | 0.50 | 1.00 | — | — | — | 0.50 | 1.00 | 2.00 |
| Crosscut adhesion test (after environmental test/before environmental test | 45/100 | 90/100 | 100/100 | 100/100 | 33/100 | 80/100 | 100/100 | 100/100 | 100/100 | 100/100 |

[Measurement of Water Vapor Permeation Rate]

A cast polypropylene film having a thickness of 50 μm was laminated onto the resulting silicon oxide vapor deposited resin sheet on the vapor deposited side thereof followed by evaluation according to the procedure described below in compliance with the conditions of JIS Z0222 "test method of moisture permeability for moisture proof packing container" and JIS Z0208 "test method of moisture permeability for moisture proof package material (cup method)".

Using two laminates of the aforementioned vapor deposited resin sheets having a moisture permeable surface area of 10.0 cm×10.0 cm square, approximately 20 g of anhydrous calcium chloride were added as moisture absorbent followed by sealing the four sides to form a pouch, placing the pouch in a constant-humidity, constant-temperature device at a temperature of 40° C. and relative humidity 90%, measuring the weight (in 0.1 mg units) until 30 days had elapsed as a general indicator of the rate of weight gain having become nearly constant, and then calculating the water vapor permeation rate (g/m$^2$/24 hr).

The value of water vapor permeation rate as described above indicates that the water vapor permeability rate of the protective sheet for a solar cell module of the present invention is extremely low.

Example 3

Next, fluorine resin layers were formed in the same manner as Example 1 with the exception of forming the vapor depos- Test Examples 26 to 29 respectively correspond to Test Examples 7 to 10, and Test Examples 30 to 35 respectively correspond to Test Examples 20 to 25. Based on a comparison of these corresponding Test Examples, a protective sheet for a solar cell module having silicon oxide having an acid value of less than 2 for the vapor deposited layer was determined to demonstrate an even lower separation rate of the fluorine resin layer 14 and demonstrate favorable adhesion of the fluorine resin layer 14 to the vapor deposited layer 12 in comparison with a protective sheet for a solar cell module having silicon dioxide for the vapor deposited layer.

INDUSTRIAL APPLICABILITY

According to the protective sheet for a solar cell module of the present invention, as a result of having a resin sheet, a vapor deposited layer composed of an inorganic oxide provided on at least one side thereof, and a fluorine resin layer containing a silane coupling agent laminated on the vapor deposited layer, adhesion of the fluorine resin layer to the vapor deposited layer is improved and separation of the fluorine resin layer from the vapor deposited layer can be controlled. Thus, the present invention is extremely industrially useful.

DESCRIPTION OF THE REFERENCE SYMBOLS

10,20: protective sheet for solar cell module, 11: resin sheet, 12: vapor deposited layer, 13: fluorine resin layer, 14: thermal adhesive layer, 15: adhesive layer

The invention claimed is:

1. A protective sheet for a solar cell module, comprising: a resin sheet, a vapor deposited layer containing an inorganic oxide provided on at least one side thereof, and a fluorine resin layer containing a fluorine-containing resin and a silane coupling agent laminated directly on the vapor deposited layer, wherein the resin sheet is composed of at least one polymer selected from the group consisting of polyethylene, polypropylene, polystyrene, poly(methyl methacrylate), polyamide, polyacrylonitrile, polyvinyl chloride, polyethylene terephthalate, polybutylene terephthalate, polyethylene naphthalate, polyoxymethylene, polycarbonate, polyphenylene oxide, polyester urethane, poly-m-phenylene isophthalamide and poly-p-phenylene terephthalamide.

2. The protective sheet for a solar cell module according to claim 1, wherein the silane coupling agent is an alkoxysilane having an epoxy group.

3. The protective sheet for a solar cell module according to claim 1, wherein the vapor deposited layer is composed of silicon oxide and/or aluminum oxide.

4. The protective sheet for a solar cell module according to claim 3, wherein the silicon oxide is SiOx (wherein, $1.2 \leq x \leq 1.9$).

5. The protective sheet for a solar cell module according to claim 1, wherein the vapor deposited layer contains a silicon oxide represented by SiOx (wherein, $1.2 \leq x \leq 1.9$).

6. The protective sheet for a solar cell module according to claim 1, further comprising: a thermal adhesive layer which is laminated to a side on the opposite side of the resin sheet from the side on which the fluorine resin layer is laminated, and an adhesive layer which is interposed there between the resin sheet and the thermal adhesive layer.

* * * * *